United States Patent
Morrissey et al.

(10) Patent No.: US 6,797,146 B2
(45) Date of Patent: Sep. 28, 2004

(54) SEED LAYER REPAIR

(75) Inventors: Denis Morrissey, Huntington, NY (US); Jeffrey M. Calvert, Acton, MA (US); Robert D. Mikkola, Grafton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 215 days.

(21) Appl. No.: 10/003,151

(22) Filed: Nov. 2, 2001

(65) Prior Publication Data

US 2002/0053519 A1 May 9, 2002

Related U.S. Application Data

(60) Provisional application No. 60/245,308, filed on Nov. 2, 2000.

(51) Int. Cl.$^7$ ............... C25D 3/38; C25D 5/02
(52) U.S. Cl. ............ 205/291; 205/123; 205/157
(58) Field of Search ............... 205/238, 239, 205/261, 291, 118, 123, 157, 296

(56) References Cited

U.S. PATENT DOCUMENTS

| | | | |
|---|---|---|---|
| 2,525,943 A | 10/1950 | Proell | 204/52 |
| 2,871,173 A | 1/1959 | Castellano | |
| 4,537,855 A | 8/1985 | Ide | 430/285 |
| 4,695,527 A | 9/1987 | Geissler et al. | 430/256 |
| 5,045,435 A | 9/1991 | Adams et al. | 430/288 |
| 5,389,495 A | 2/1995 | Barr | 430/281 |
| 5,433,840 A * | 7/1995 | Dahms et al. | 205/296 |
| 5,824,599 A | 10/1998 | Schacham-Diamond | |
| 5,925,153 A | 7/1999 | Riegel | 44/367 |
| 5,939,239 A | 8/1999 | Lundy et al. | 430/248.1 |
| 6,063,172 A * | 5/2000 | Bokisa et al. | 106/1.22 |
| 6,531,046 B2 * | 3/2003 | Morrissey et al. | 205/219 |
| 2002/0000382 A1 | 1/2002 | Morrissey et al. | |
| 2002/0043467 A1 * | 4/2002 | Morrissey et al. | 502/157 |
| 2002/0043468 A1 * | 4/2002 | Mikkola et al. | 205/157 |
| 2002/0053519 A1 | 5/2002 | Morrissey et al. | |
| 2002/0088713 A1 * | 7/2002 | Merricks et al. | 205/80 |
| 2002/0153260 A1 * | 10/2002 | Egli et al. | 205/300 |
| 2002/0166774 A1 | 11/2002 | Schetty et al. | |
| 2002/0187355 A1 * | 12/2002 | Crosby | 428/432 |

FOREIGN PATENT DOCUMENTS

| | | |
|---|---|---|
| EP | 0 952 242 A1 | 10/1999 |
| WO | WO 99/47731 | 9/1999 |

OTHER PUBLICATIONS

Braun et al., "Electrodeposition of Copper from Acid Electrolytes Containing Nitrate Ions", Protection of Metals, vol. 26, No. 3, May 1, 1990, pp. 379–381.

Database WPI, Section Ch., Week 199218, Derwent Publications Ltd., London, GB; AN 1992–148450 XP002193404 & SU 1 650 786 A (Formichev V T), May 23, 1991— Abstract.

"Chemical Abstracts + Indexes, American Chemical Society, Columbus, US" Chemical Abstracts + Indexes, American Chemical Society, Columbus, US, XP–000193673, ISSN: 0009-2258—Abstract, no date.

* cited by examiner

Primary Examiner—Edna Wong
(74) Attorney, Agent, or Firm—S. Matthew Cairns

(57) ABSTRACT

Disclosed are methods for repairing seed layers prior to subsequent metallization during the manufacture of electronic devices. Also disclosed are electronic devices containing substantially continuous seed layers.

18 Claims, No Drawings

SEED LAYER REPAIR

This application claims the benefit of U.S. Provisional Application No. 60/245,308, filed on Nov. 2, 2000.

BACKGROUND OF THE INVENTION

The present invention relates generally to the field of electroplating. In particular, the present invention relates to the field of copper electroplating on a seed layer.

The trend toward smaller microelectronic devices, such as those with sub-micron geometries, has resulted in devices with multiple metallization layers to handle the higher densities. One common metal used for forming metal lines, also referred to as wiring, on a semiconductor wafer is aluminum. Aluminum has the advantage of being relatively inexpensive, having low resistivity, and being relatively easy to etch. Aluminum has also been used to form interconnections in vias to connect the different metal layers. However, as the size of via/contact holes shrinks to the sub-micron region, a step coverage problem appears which in turn can cause reliability problems when using aluminum to form the interconnections between the different metal layers. Such poor step coverage results in high current density and enhances electromigration.

One approach to providing improved interconnection paths in the vias is to form completely filled plugs by using metals such as tungsten while using aluminum for the metal layers. However, tungsten processes are expensive and complicated, tungsten has high resistivity, and tungsten plugs are susceptible to voids and form poor interfaces with the wiring layers.

Copper has been proposed as a replacement material for interconnect metallizations. Copper has the advantages of improved electrical properties as compared to tungsten and better electromigration property and lower resistivity than aluminum. The drawbacks to copper are that it is more difficult to etch as compared to aluminum and tungsten and it has a tendency to migrate into (and diffuse rapidly through a) dielectric layer such as silicon dioxide. To prevent such migration, a barrier layer, such as titanium nitride, tantalum, tantalum nitride, tantalum silicon nitride, tungsten nitride, and the like, must be used prior to the depositing of a copper layer.

Typical techniques for applying a copper layer, such as electrochemical deposition, are only suitable for applying copper to an electrically conductive layer. Thus, an underlying conductive seed layer, typically a metal seed layer such as copper, is generally applied to the substrate prior to electrochemically depositing copper. Such seed layers may be applied by a variety of methods, such as physical vapor deposition ("PVD"; which includes sputtering, evaporation, or deposition from ionized metal plasma of hollow cathode magnetron sources) and chemical vapor deposition ("CVD", which includes deposition from metal or organometallic precursors comprising one of more metal atoms in combination with inorganic or organic ligands such as halides, pseudohalides, carbonyls, nitriles, alkyls, olefins, allyls, arenes, phosphines, amines, and the like). Typically, seed layers are thin in comparison to other metal layers, such as from 50 to 1500 angstroms thick. Such metal seed layers, particularly copper seed layers, may suffer from problems such as metal oxide both on the surface of the seed layer and in the bulk of the layer as well as significant variations in thickness or discontinuities in the layer.

Oxide on a metal seed layer, particularly a copper seed layer, interferes with subsequent copper deposition. Such oxide forms from exposure of the metal seed layer to sources of oxygen, such as air. Typically, the longer such seed layer is exposed to oxygen, the greater the amount of oxide formation. Where a copper seed layer is thin, the copper oxide may exist as copper oxide throughout the layer. In other areas of electroplating, such as in electronics finishing, copper oxide layers are typically removed by acidic etching baths. These baths dissolve the oxide layer, leaving a copper metal surface. Such etching processes are not generally applicable to copper seed layers because of the thinness of the seed layer. As the oxide is removed from the seed layer surface there is the danger that the entire seed layer may be removed in places, creating discontinuities in the seed layer.

U.S. Pat. No. 5,824,599 (Schacham-Diamand et al.) discloses a method of preventing oxide formation on the surface of a copper seed layer by conformally blanket depositing under vacuum a catalytic copper layer over a barrier layer on a wafer and then, without breaking the vacuum, depositing a protective aluminum layer over the catalytic copper layer. The wafer is then subjected to an electroless copper deposition solution which removes the protective aluminum layer exposing the underlying catalytic copper layer and then electrolessly deposits copper thereon. However, such method requires the use of a second metal, aluminum, which adds to the cost of the process and the presence of any unremoved protective layer prior to the electroless deposition of the copper may cause problems in the final product, such as an increase in resistivity. In addition, the dissolved aluminum may build up in the electroless copper bath, which could also cause problems in the final product.

The step coverage by the PVD copper seed layer at apertures less than 0.18 $\mu$m on advanced interconnects becomes a limiting factor for void free copper fill. Decreased step coverage on the lower sidewalls of vias and trenches leads to a thin and discontinuous copper seed layer. Discontinuities or voids are areas in the seed layer where coverage of the metal, such as copper, is incomplete or lacking. Such discontinuities can arise from insufficient blanket deposition of the metal layer, such as depositing the metal in a line of sight fashion. Subsequent copper electroplating fill with traditional electrolytes and additives results in the formation of bottom voids, associated with incomplete fill over the discontinuous copper seed. In order for a complete metal layer to be electrochemically deposited on such a seed layer, the discontinuities must be filled in prior to or during the deposition of the final metal layer, or else voids in the final metal layer may occur.

PCT patent application number WO 99/47731 (Chen) discloses a method of providing a seed layer by first vapor depositing an ultra-thin seed layer followed by electrochemically enhancing the ultra-thin seed layer to form a final seed layer. According to this patent application, a two step process provides a seed layer having reduced discontinuities. The copper seed layer is enhanced by using an alkaline electrolytic bath. One using this method to enhance a seed layer would have to rinse and neutralize the seed layer before using conventional acidic electrolytic plating baths. In addition, a manufacturer using such alkaline enhancement method in combination with an acid electroplating bath would have to double the number of plating heads on the plating tool or throughput would decrease.

In general, the electrochemical metallization process for advanced interconnects uses a highly conductive sulfuric acid electrolyte (170 g/L $H_2SO_4$), cupric sulfate (17 g/L), and chloride ions (50–70 mg/L). An organic additive package is used to assist in the development of bottom-up fill, and to promote a uniform thickness of copper across the wafer. Such additive package typically includes accelerators, suppressors and levelers and may optionally include surfactants, defoamers, or ductilizers for the purpose of modifying the properties of the plating bath or the resultant metal deposits. A balance must be struck between the use of such accelerators, suppressors, levelers, and other additives to achieve the desired level of copper fill of apertures without void formation. If such balance is not achieved, then the plating across the wafer may occur much faster than plating within the aperture, resulting in void formation within the apertures. Also, if one of these organic additives is consumed at a faster rate than the others, the plating characteristics of the bath may change. Alternatively, if one of the organic additives is incorrectly added to the electroplating bath, either during bath make-up or replenishment, the plating characteristics of the bath may not be optimum. Thus, it is desirable to provide or enhance bottom-up fill (superfill) with less reliance on the use of organic additives.

Also, exposure of marginally thin copper seed to the highly acidic electrolyte results in partial or complete removal of the thin conductive copper oxide layer on the seed layer, which can expose the underlying agglomerated copper seed layer ("copper islands"). Copper electroplating with traditional chemistry formulations is not adequate for repair of the thin-agglomerated copper seed, and the final fill result contains bottom voids.

Thus, there is a continuing need for methods of repairing seed layers having discontinuities. There is also a continuing need for electroplating baths that provide good fill of recessed features, that do not require the use of additional metals, that enhance the lateral growth of seed layers to reduce or remove discontinuities, and that are compatible with commercial metal deposition processes, and have less reliance on the use of organic additives.

SUMMARY OF THE INVENTION

It has been surprisingly found that acidic electroplating solutions may be used to repair copper seed layer by providing seed layers substantially free of discontinuities prior to subsequent metallization.

In one aspect, the present invention provides a method of providing a metal seed layer substantially free of discontinuities disposed on a substrate including the steps of contacting a metal seed layer disposed on a substrate with an electroplating bath including a) a source of metal ions; b) an electrolyte including two or more acids; c) and optionally one or more additives.

In a second aspect, the present invention provides a method of manufacturing an electronic device including the step of contacting a metal seed layer disposed on a substrate with an electroplating bath including a) a source of metal ions; b) an electrolyte including two or more acids; c) and optionally one or more additives.

In a third aspect, the present invention provides an article of manufacture including an electronic device substrate containing one or more apertures, each aperture containing a seed layer deposit obtained from an electroplating composition that includes a) a source of metal ions; b) an electrolyte including two or more acids; c) and optionally one or more additives.

In a fourth aspect, the present invention provides a method for removing excess material from a semiconductor wafer containing one or more apertures by using a chemical mechanical planarization process which includes contacting the semiconductor wafer with a rotating polishing pad thereby removing the excess material from the semiconductor wafer; wherein the apertures contain a seed layer deposit obtained from an electroplating composition that includes a) a source of metal ions; b) an electrolyte including two or more acids; c) and optionally one or more additives.

DETAILED DESCRIPTION OF THE INVENTION

As used throughout the specification, the following abbreviations shall have the following meanings, unless the context clearly indicates otherwise: nm=nanometers; g/L= grams per liter; ASF=amperes per square foot; M=molar; and ppm=parts per million.

As used throughout the specification, "feature" refers to the geometries on a substrate, such as, but not limited to, trenches and vias. "Apertures" refer to recessed features, such as vias and trenches. The term "small features" refers to features that are one micron or smaller in size. "Very small features" refers to features that are one-half micron or smaller in size. Likewise, "small apertures" refer to apertures that are one micron or smaller in size and "very small apertures" refer to apertures that are one-half micron or smaller in size. As used throughout this specification, the term "plating" refers to metal electroplating, unless the context clearly indicates otherwise. "Deposition" and "plating" are used interchangeably throughout this specification. The term "accelerator" refers to a compound that enhances the plating rate. The term "suppressor" refers to a compound that suppresses the plating rate. "Halide" refers to fluoride, chloride, bromide, and iodide.

All percentages and ratios are by weight unless otherwise indicated. All ranges are inclusive and combinable.

The present invention provides certain electroplating baths that are capable of providing substantially continuous seed layers and substantially or completely filling recessed features. Such electroplating baths that are capable of providing seed layers, particularly copper or copper alloy seed layers, that are substantially free of discontinuities or voids. The present electroplating baths are particularly suitable for use in the manufacture of electronic devices, and particularly in the manufacture of integrated circuits. Thus, the present invention provides a method of providing a metal seed layer substantially free of discontinuities disposed on a substrate including the steps of contacting a metal seed layer disposed on a substrate with an electroplating bath including a) a source of metal ions; b) an electrolyte including two or more acids; c) and optionally one or more additives.

Electroplating solutions of the present invention generally include at least one soluble metal compound, typically a soluble metal salt. A wide variety of metal salts are suitable such as, but not limited to, silver, copper and the like. Copper electroplating baths are preferred. The present invention will be described with respect to copper electroplating baths. Preferred electroplating baths include one or more copper salts and an acidic electrolyte including two or more acids. The electroplating solutions of the present invention may optionally contain one or more additives, such as halides, accelerators or brighteners, suppressors, levelers, grain refiners, wetting agents, surfactants and the like.

A variety of copper salts may be employed in the subject electroplating solutions, including for example copper sulfates, copper acetates, copper fluoroborate, and cupric nitrates. Copper sulfate pentahydrate is a particularly preferred copper salt. A copper salt may be suitably present in a relatively wide concentration range in the electroplating compositions of the invention. Preferably, a copper salt will be employed at a concentration of from about 1 to about 300 g/L of plating solution, more preferably at a concentration of from about 10 to about 225 g/L, still more preferably at a concentration of from about 25 to about 175 g/L. The copper plating bath may also contain amounts of other alloying elements, such as, but not limited to, tin, zinc, and the like. Thus, the copper electroplating baths useful in the present invention may deposit copper or copper alloy.

Plating baths of the invention employ an acidic electrolyte including two or more acids. Preferred electrolytes include two acids or three acids, and more preferably two acids. Suitable acids are inorganic or organic. Thus, the two or more acids useful in the present invention may be two or more inorganic acids, two or more organic acids, or a mixture of inorganic and organic acids. Suitable inorganic acids include, but are not limited to, sulfuric acid, phosphoric acid, nitric acid, hydrogen halide acids, sulfamic acid, fluoroboric acid and the like. Suitable organic acids include, but are not limited to, alkylsulfonic acids such as methanesulfonic acid, aryl sulfonic acids such as phenylsulfonic acid and tolylsulfonic acid, carboxylic acids such as formic acid, acetic acid and propionic acid, halogenated acids such as trifluoromethylsulfonic acid and haloacetic acid, and the like. Particularly suitable organic acids include ($C_1$–$C_{10}$) alkylsulfonic acids. Particularly suitable combinations of acids include one or more inorganic acids with one or more organic acids or a mixture of two or more organic acids.

It has been surprisingly found that organic acids provide enhanced seed layer repair, particularly of copper seed layers. By "enhanced seed layer repair" it is meant that the organic acids enhance lateral growth of metal deposits. By "enhancing" a discontinuous metal seed layer is meant that the seed layer is repaired or extended to substantially fill in, and preferably fill in, such discontinuities or areas devoid of seed layer. Thus, It is preferred that at least one of the acids be an organic acid, and preferably an alkylsulfonic acid or an arylsulfonic acid. It has also been surprisingly found that mixtures of organic acids, particularly mixtures of alkylsulfonic acids, greatly enhance discontinuous seed layers. While alkylsulfonic acids generally have been found to enhance discontinuous seed layers, preferred alkylsulfonic acids are $C_1$–$C_{10}$)alkylsulfonic acids, preferably ($C_2$–$C_8$) alkylsulfonic acids, and more preferably ($C_3$–$C_6$) alkylsulfonicacids.

Suitable mixtures of acids include, but are not limited to, sulfuric acid/methane sulfonic acid, fluoroboric acid/trifluoromethanesulfonic acid, sulfuric acid/methanesulfonic acid/phenylsulfonic acid, nitric acid/sulfuric acid/methanesulfonic acid, methanesulfonic acid/ethanesulfonic acid/phenylsulfonic acid, methanesulfonic acid/ethanesulfonic acid, methanesulfonic acid/ethanesulfonic acid/sulfuric acid, sulfuric acid/acetic acid/methanesulfonic acid, sulfuric acid/methanesulfonic acid/propionic acid, trichloroacetic acid/sulfuric acid, trichloroacetic acid/sulfuric acid/methanesulfonic acid, trichloroacetic acid/sulfuric acid/phenylsulfonic acid, methanesulfonic acid/propanesulfonic acid, methanesulfonic acid/ethanesulfonic acid/propanesulfonic acid, sulfuric acid/propanesulfonic acid, propanesulfonic acid/phenylsulfonic acid, sulfuric acid/propanesulfonic acid/phenylsulfonic acid and the like.

Typically, the two or more acids may be present in any ratio. For example, when two acids are used, they may be present in any ratio from 99:1 to 1:99. Preferably, the two acids are present in a ratio from 90:10 to 10:90, more preferably from 80:20 to 20:80, still more preferably from 75:25 to 25:75, and even more preferably from 60:40 to 40:60. When three or more acids are used, they may be used in any ratio. The two or more acids in the present electrolytes are not intended to include the minor amounts (typically less than 100 mg/L) of hydrogen halide acids conventionally used as a source of halide ions.

The total amount of added acid used in the present electroplating baths may be from about 1 to about 350 g/L, and preferably from 1 to 225 g/L. When two inorganic acids are used, it is preferred that each acid be present in an amount of at least about 0.5 g/L, preferably at least about 1 g/L, and more preferably at least about 2 g/L. It will be appreciated by those skilled in the art that by using a metal sulfate as the metal ion source, an acidic electrolyte can be obtained without any added acid. Thus, if a metal sulfate is used, only one additional acid needs to be added to provide an electrolyte having two or more acids. If a hydrogen halide acid is used, it is preferably used in an amount greater than 50 mg/L, more preferably greater than or equal to 100 mg/L, still more preferably greater than or equal to 200 mg/L, and even more preferably greater than or equal to 500 mg/L.

For certain applications, such as in the plating of wafers having very small apertures, it is preferred that the total amount of added acid be low. By "low acid" is meant that the total amount of added acid in the electrolyte is less than about 0.4 M, preferably less than about 0.3 M, and more preferably less than about 0.2 M.

The present mixed acid electrolytes may optionally contain one or more halides, and preferably do contain at least one halide. Chloride and bromide are preferred halides, with chloride being more preferred. A wide range of halide ion concentrations (if a halide ion is employed) may be suitably utilized, e.g. from about 0 (where no halide ion employed) to 100 ppm of halide ion in the plating solution, more preferably from about 25 to about 75 ppm. Such halides may be added as the corresponding hydrogen halide acid or as any suitable salt.

A wide variety of brighteners (or accelerators), including known brightener agents, may be employed in the copper electroplating compositions of the invention. Typical brighteners contain one or more sulfur atoms, and typically without any nitrogen atoms and a molecular weight of about 1000 or less. Brightener compounds that have sulfide and/or sulfonic acid groups are generally preferred, particularly compounds that comprise a group of the formula R'—S—R—$SO_3$X, where R is an optionally substituted alkyl (which include cycloalkyl), optionally substituted heteroalkyl, optionally substituted aryl group, or optionally substituted heteroalicyclic; X is a counter ion such as sodium or potassium; and R' is hydrogen or a chemical bond (i.e. —S—R—$SO_3$X or substituent of a larger compound). Typically alkyl groups will have from one to about 16 carbons, more typically one to about 8 or 12 carbons. Heteroalkyl groups will have one or more hetero (N, O or S) atoms in the chain, and preferably have from 1 to about 16 carbons, more typically 1 to about 8 or 12 carbons. Carbocyclic aryl groups are typical aryl groups, such as phenyl and naphthyl. Heteroaromatic groups also will be suitable aryl groups, and typically contain 1 to about 3 N, O or S atoms and 1–3 separate or fused rings and include e.g. coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, benzothiazol, and the like. Heteroalicyclic groups typically will have 1 to 3 N, O or S atoms and from 1 to 3—separate or fused rings and include e.g. tetrahydrofuranyl, thienyl, tetrahydropyranyl, piperdinyl, morpholino, pyrrolindinyl, and the like. Substituents of substituted alkyl, heteroalkyl, aryl or heteroalicyclic groups include e.g. $C_{1-8}$ alkoxy; $C_{1-8}$ alkyl, halogen, particularly F. Cl and Br; cyano, nitro, and the like.

More specifically, useful brighteners include those of the following formulae:

$$XO_3S-R-SH$$

$$XO_3S-R-S-S-R-SO_3X \text{ and}$$

$$XO_3S-Ar-S-S-Ar-SO_3X$$

where in the above formulae R is an optionally substituted alkyl group, and preferably is an alkyl group having from 1 to 6 carbon atoms, more preferably is an alkyl group having from 1 to 4 carbon atoms; Ar is an optionally substituted aryl group such as optionally substituted phenyl or naphthyl; and X is a suitable counter ion such as sodium or potassium.

Some specific suitable brighteners include e.g. N,N-dimethyl-dithiocarbamic acid-(3-sulfopropyl)ester; 3-mercapto-propylsulfonic acid-(3-sulfopropyl)ester; 3-mercapto-propylsulfonic acid (sodium salt); carbonic acid-dithio-o-ethylester-s-ester with 3-mercapto-1propane sulfonic acid (potassium salt); bissulfopropyl disulfide; 3-(benzthiazolyl-s-thio)propyl sulfonic acid (sodium salt); pyridinium propyl sulfobetaine; 1-sodium-3-mercaptopropane-1-sulfonate; sulfoalkyl sulfide compounds disclosed in U.S. Pat. No. 3,778,357; the peroxide oxidation product of a dialkyl amino-thiox-methyl-thioalkanesulfonic acid; and combinations of the above. Additional suitable brighteners are also described in U.S. Pat. Nos. 3,770,598, 4,374,709, 4,376,685, 4,555,315, and 4,673,469, all incorporated herein by reference. Particularly preferred brighteners for use in the plating compositions of the invention are N,N-dimethyl-dithiocarbamic acid-(3-sulfopropyl)ester and bis-sodium-sulfonopropyl-disulfide.

The amount of such accelerators present in the electroplating baths is in the range of from about 0.1 to about 1000 ppm. Preferably, the accelerator compounds are present in an amount of from about 0.5 to about 300 ppm, more preferably from about 1 to about 100 ppm, and still more preferably from about 2 to about 50 ppm.

The suppressor agents useful in the compositions of the invention are polymeric materials, preferably having heteroatom substitution, particularly oxygen linkages. Generally preferred suppressor agents are generally high molecular weight polyethers, such as those of the following formula:

$$R-O-(CXYCX'Y'O)_nH$$

where R is an aryl or alkyl group containing from about 2 to 20 carbon atoms; each X, Y, X' and Y' is independently hydrogen, alkyl preferably methyl, ethyl or propyl, aryl such as phenyl; aralkyl such as benzyl; and preferably one or more of X, Y, X' and Y' is hydrogen; and n is an integer between 5 and 100,000. Preferably, R is ethylene and n is greater than 12,000.

The amount of such suppressors present in the electroplating baths is in the range of from about 0.1 to about 1000 ppm. Preferably, the suppressor compounds are present in an amount of from about 0.5 to about 500 ppm, and more preferably from about 1 to about 200 ppm.

Surfactants may optionally be added to the electroplating baths. Such surfactants are typically added to copper electroplating solutions in concentrations ranging from about 1 to 10,000 ppm based on the weight of the bath, more preferably about 5 to 10,000 ppm. Particularly suitable surfactants for plating compositions of the invention are commercially available polyethylene glycol copolymers, including polyethylene glycol copolymers. Such polymers are available from e.g. BASF (sold by BASF under TETRONIC and PLURONIC tradenames), and copolymers from Chemax.

Levelers may optionally be added to the present electroplating baths. It is preferred that one or more leveler components is used in the present electroplating baths. Such levelers may be used in amounts of from about 0.01 to about 50 ppm. Examples of suitable leveling agents are described and set forth in U.S. Pat. Nos. 3,770,598, 4,374,709, 4,376, 685, 4,555,315 and 4,673,459. In general, useful leveling agents include those that contain a substituted amino group such as compounds having R—N—R', where each R and R' is independently a substituted or unsubstituted alkyl group or a substituted or unsubstituted aryl group. Typically the alkyl groups have from 1 to 6 carbon atoms, more typically from 1 to 4 carbon atoms. Suitable aryl groups include substituted or unsubstituted phenyl or naphthyl. The substituents of the substituted alkyl and aryl groups may be, for example, alkyl, halo and alkoxy.

More specifically, suitable leveling agents include, but are not limited to, 1-(2hydroxyethyl)-2-imidazolidinethione; 4-mercaptopyridine; 2-mercaptothiazoline; ethylene thiourea; thiourea; alkylated polyalkyleneimine; phenazonium compounds disclosed in U.S. Pat. No. 3,956,084; N-heteroaromatic rings containing polymers; quaternized, acrylic, polymeric amines; polyvinyl carbamates; pyrrolidone; and imidazole. A particularly preferred leveler is 1-(2-hydroxyethyl)-2-imidazolidinethione.

The present copper electroplating compositions are suitably used in similar manner as prior copper electroplating baths. Plating baths of the invention are preferably employed at or above room temperature, e.g. up to 65° C. and greater. The plating composition is preferably agitated during use such as by air sparger, work piece agitation, impingement or other suitable method. Plating is preferably conducted at a current density ranging from 1 to 40 ASF depending upon substrate characteristics. Plating time may range from about 5 minutes to 1 hour or more, depending on the difficulty of the work piece.

The compositions of the invention are particularly useful to enhance or repair seed layers on a wide variety of electronic device substrates. Particularly suitable are substrates used in the manufacture of electronic devices, such as wafers used in the manufacture of integrated circuits, printed wiring board inner layers and outer layers, flexible circuits and the like. It is preferred that the substrate is a wafer. The compositions of the invention are particularly suitable for enhancing discontinuous seed layers on electronic device substrates having high aspect ratio microvias and trenches, such as those having aspect ratios of 4:1 or greater.

As discussed above, aspect ratios of at least 4:1, having diameters of about 200 nm or smaller have been effectively copper plated with no defects (e.g. no voids or inclusions by ion beam examination) using plating solutions of the invention. Apertures with diameters below 150 nm, or even below about 100 nm, and aspect ratios of 5:1, 6:1, 7:1, 10:1 or greater, and even up to about 15:1 or greater can be effectively plated (e.g. no voids or inclusions by ion beam examination) using plating solutions of the invention. The present invention is particularly suitable for repairing seed layers on substrates having 0.18 μm and smaller apertures.

Thus, the present invention provides a method of providing a metal seed layer substantially free of discontinuities disposed on a substrate comprising the steps of contacting a metal seed layer disposed on a substrate with an electroplating bath electroplating bath including a) a source of metal ions; b) an electrolyte including two or more acids; c) and optionally one or more additives. The present methods provide substantially continuous seed layers, i.e. the seed layer covers >95% of the surface area of the substrate, preferably >98%, and more preferably >99%. While not intending to be bound by theory, the present electroplating baths deposit copper in a substantially horizontal manner, such that discontinuities or voids in the seed layer are filled in or repaired preferentially to depositing copper within the apertures, i.e. the present invention does not substantially provide bottom-up fill (or superfill) of the apertures. It will be appreciated by those skilled in the art that one or more additives may be combined with the present electroplating bath to provide a bath that substantially enhances discontinuous seed layers and provides superfill of apertures.

"Superfill" or bottom-up fill occurs when metal plating at the bottom of features, particularly small features, is faster than plating occurring on the top surface of the substrate to be plated. "Conformal plating" occurs when metal plating following the surface topography is occurs at the same rate as metal plating in the bottom of features, such as trenches or vias. At times, conformal plating is desired, while at other times superfill plating is desired. In the manufacture of certain electronic devices, such as wafers used in the manufacture of integrated circuits or semiconductors having small or very small features, superfill plating is desired. Particularly desired is superfill copper electroplating in such electronic device manufacture.

In general, superfill deposition occurs when the deposition rate at the bottom of the features is greater than the deposition rate at the top surface of the substrate. While not intending to be bound by theory, it is believed that the deposition rate at the surface of the substrate is controlled by mass transport (convection) of the reactants in the plating bath and the magnitude of the current applied. It is further believed, while not intending to be bound by theory, that convection inside the features is unimportant when plating very small features and that the deposition rate inside the features is controlled by mass transport (diffusion).

The present invention also provides a method of manufacturing an electronic device including the step of contacting a metal seed layer disposed on a substrate with an electroplating bath including a) a source of metal ions; b) an electrolyte including two or more acids; c) and optionally one or more additives. Accordingly, the present invention also provides an article of manufacture including an electronic device substrate containing one or more apertures, each aperture containing a seed layer deposit obtained from an electroplating composition that includes a) a source of metal ions; b) an electrolyte including two or more acids; c) and optionally one or more additives.

Once a seed layer is repaired according to the present invention, it is subsequently metallized to fill or substantially fill the apertures. After treatment according to the present method, the substrate, such as a wafer, may be contacted directly with a metallization bath. A rinsing step between the present seed layer repair treatment and contact with a subsequent metallization bath is optional, but is not preferred.

The substantially continuous seed layer provided by the present invention is contacted with a conventional metallization bath, such as an acid copper bath, to fill or substantially fill the apertures. Such conventional metallization baths are well known to those skilled in the art and are generally a more concentrated form of the present electroplating baths. Preferably, such copper electroplating baths provide superfill of apertures. In such conventional acid copper baths, the copper ions are typically present in an amount of from 14 to 21 g/L with the total added acid being from about 150 to 200 g/L or more. Such metallization baths may optionally contain one or more additional components, such as those described above. After metallization, i.e. filling of the apertures, the substrate, in the case of a wafer, is preferably subjected to chemical-mechanical planarization ("CMP"). A CMP procedure can be conducted in accordance with the invention as follows.

The wafer is mounted in a wafer carrier which urges the wafer against the surface of a moving polishing pad. The polishing pad can be a conventional smooth polishing pad or a grooved polishing pad. Examples of a grooved polishing pad are described in U.S. Pat. Nos. 5,177,908; 5,020,283; 5,297,364; 5,216,843; 5,329,734; 5,435,772; 5,394,655; 5,650,039; 5,489,233; 5,578,362; 5,900,164; 5,609,719; 5,628,862; 5,769,699; 5,690,540; 5,778,481; 5,645,469; 5,725,420; 5,842,910; 5,873,772; 5,921,855; 5,888,121; 5,984,769; and European Patent 806267. The polishing pad can be located on a conventional platen can rotate the polishing pad. The polishing pad can be held on the platen by a holding means such as, but not limited to, an adhesive, such as, two faced tape having adhesive on both sides.

A polishing solution or slurry is fed onto the polishing pad. The wafer carrier can be at a different positions on the polishing pad. The wafer can be held in position by any suitable holding means such as, but is not limited to, a wafer holder, vacuum or liquid tensioning such as, but not limited to a fluid such as, but not limited to water. If the holding means is by vacuum then there is preferably a hollow shaft which is connected to the wafer carrier. Additionally, the hollow shaft could be used to regulate gas pressure, such as, but not limited to air or an inert gas or use a vacuum to initially hold the wafer. The gas or vacuum would flow from the hollow shaft to the carrier. The gas can urge the wafer against the polishing pad for the desired contour. The vacuum can initially hold the wafer into position in the wafer carrier. Once the wafer is located on top of the polishing pad the vacuum can be disengaged and the gas pressure can be engaged to thrust the wafer against the polishing pad. The excess or unwanted copper is then removed. The platen and wafer carrier can be independently rotatable. Therefore, it is possible to rotate the wafer in the same direction as the polishing pad at the same or different speed or rotate the wafer in the opposite direction as the polishing pad.

Thus, the present invention provides a method for removing excess material from a semiconductor wafer containing one or more apertures by using a chemical mechanical planarization process which includes contacting the semiconductor wafer with a rotating polishing pad thereby removing the excess material from the semiconductor wafer; wherein the apertures contain a seed layer deposit obtained from an electroplating composition that includes a) a source of metal ions; b) an electrolyte including two or more acids; c) and optionally one or more additives.

While the present invention has been described with respect to copper electroplating baths, it will be appreciated by those skilled in the art that the present mixed acid electrolyte may be used with a variety of plating baths, such as tin, tin alloy, nickel, nickel-alloy, and the like.

What is claimed is:

1. A method of providing a metal seed layer substantially free of discontinuities disposed on a substrate comprising the step of contacting a metal seed layer having discontinuities disposed on a substrate with an electroplating bath comprising a) a source of copper ions; b) an electrolyte comprising two or more acids; c) and optionally one or more additives; wherein the two acids are present in a ratio of 99:1 to 1:99 by weight; and electroplating copper on the metal seed layer, wherein the substrate comprises apertures having diameters of 0.18 µm or smaller, and wherein at least one acid is a $(C_3-C_6)$alkylsulfonic acid.

2. The method of claim 1 wherein the acids are chosen from organic acids, inorganic acids, or mixtures thereof.

3. The method of claim 2 wherein the organic acids are chosen from alkylsulfonic acids, aryl sulfonic acids, carboxylic acids or halogenated acids.

4. The method claim 2 wherein the inorganic acids are chosen from sulfuric acid, phosphoric acid, nitric acid, hydrogen halide acids, sulfamic acid or fluoroboric acid.

5. The method of claim 1 wherein the acids are present in a total amount of from about 1 to about 350 g/L.

6. The method of claim 1 wherein the source of copper ions is chosen from copper sulfates, copper fluoroborate and cupric nitrates.

7. The method bath of claim 1 wherein the source of copper ions is present in an amount of from about 1 to about 300 g/L.

8. The method of claim 1 wherein the electrolyte further comprises a source of halide ions.

9. The method of claim 1 wherein the electroplating bath comprises three or more acids.

10. A method of manufacturing semiconductor device comprising the step of contacting a metal seed layer disposed on a substrate with an electroplating bath comprising a) a source of copper ions; b) an electrolyte comprising two or more acids; c) and optionally one or more additives, wherein the two acids are present in a ratio of 99:1 to 1:99 by weight; and electroplating copper on the seed layer, wherein the substrate comprises apertures having diameters of 0.18 µm or smaller, and wherein at least one acid is a $(C_3-C_6)$ alkylsulfonic acid.

11. The method of claim 10 wherein the acids are chosen from organic acids, inorganic acids, and mixtures thereof.

12. The method of claim 11 wherein the organic acids are chosen from alkylsulfonic acids, aryl sulfonic acids, carboxylic acids and halogenated acids.

13. The method claim 11 wherein the inorganic acids are chosen from sulfuric acid, phosphoric acid, nitric acid, hydrogen halide acids, sulfamic acid or fluoroboric acid.

14. The method of claim 10 wherein the two or more acids are present in a total amount of from about 1 to about 350 g/L.

15. The method of claim 10 wherein the source of metal ions is a source of copper ions is chosen from copper sulfates, copper acetates, copper fluoroborate, and cupric nitrates.

16. The method bath of claim 10 wherein the source of copper ions is present in an amount of from about 1 to about 300 g/L.

17. The method of claim 10 wherein the electrolyte further comprises a source of halide ions.

18. The method of claim 10 wherein the electroplating bath comprises three or more acids.

* * * * *